United States Patent
Murphy et al.

(10) Patent No.: US 12,375,051 B2
(45) Date of Patent: Jul. 29, 2025

(54) AUTO-CALIBRATION SYSTEMS AND METHODS FOR REDUCING AMPLIFIER OFFSET

(71) Applicant: Maxim Integrated Products, Inc., San Jose, CA (US)

(72) Inventors: Euan Patrick Murphy, West Lothian (GB); Matthew Derrell Felder, Austin, TX (US); Bryan Mo, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 170 days.

(21) Appl. No.: 18/108,198

(22) Filed: Feb. 10, 2023

(65) Prior Publication Data

US 2023/0412133 A1    Dec. 21, 2023

Related U.S. Application Data

(60) Provisional application No. 63/345,366, filed on May 24, 2022.

(51) Int. Cl.
*H03F 3/45* (2006.01)
*H03F 1/02* (2006.01)

(52) U.S. Cl.
CPC ....... *H03F 3/45605* (2013.01); *H03F 1/0216* (2013.01); *H03F 3/45475* (2013.01); *H03F 2203/45212* (2013.01)

(58) Field of Classification Search
CPC ............ H03F 3/45605; H03F 3/45475; H03F 1/0216; H03F 2203/45212
See application file for complete search history.

(56) References Cited

U.S. PATENT DOCUMENTS

| | | | |
|---|---|---|---|
| 6,617,918 B2* | 9/2003 | Casper | H03F 3/45183 327/124 |
| 8,330,631 B2* | 12/2012 | Kumar | H03M 3/384 341/120 |
| 9,337,795 B2* | 5/2016 | Das | H03G 3/3005 |
| 9,614,481 B2* | 4/2017 | Ivanov | H03F 3/45183 |

* cited by examiner

*Primary Examiner* — Menatoallah Youssef
*Assistant Examiner* — Colleen J O Toole
(74) *Attorney, Agent, or Firm* — DLA PIPER LLP (US)

(57) ABSTRACT

Systems and methods reduce unwanted effects caused by mismatch in amplifier circuits having components that are trimmable during and post-production to minimize DC offset. Various embodiments of the invention trim out amplifier mismatch by determining trim codes for two or more phases of operation of an amplifier circuit and use those trim codes to determine a final trim code for use in regular operation.

19 Claims, 8 Drawing Sheets

AUTO-CALIBRATION SYSTEMS AND METHODS FOR REDUCING AMPLIFIER OFFSET

CROSS REFERENCE TO RELATED PATENT APPLICATIONS

The present application claims priority benefit, under 35 U.S.C. § 119(e), to co-pending and commonly-assigned U.S. provisional patent application No. 63/345,366, filed on May 24, 2022, entitled "AUTO-CALIBRATION SYSTEMS AND METHODS FOR REDUCING AMPLIFER OFFSET", listing as inventors Euan Patrick Murphy, Matthew Derrell Felder, and Bryan Mo, which application is herein incorporated by reference as to its entire content. Each reference mentioned in this patent document is incorporated by reference herein in its entirety.

BACKGROUND

A. Technical Field

The present disclosure relates generally to systems and methods for electrical circuits. More particularly, the present disclosure relates to systems and methods for improving the performance of class-D amplifiers and other circuits.

B. Background

Mismatch of values of internal or external components that are coupled to the input of a class-D amplifier add a non-zero constant DC error voltage to the output signal of an amplifier that causes the voltage at the output of the amplifier to deviate from an ideal value of zero Volt. Amplifier output offset leads to undesirable effects such as, for example, pop/click sounds in audio applications. Some existing approaches attempt to reduce offset at the cost of increasing component area; however, these approaches increase total die area and, thus, increase silicon cost. Other approaches involve frequency modulation, e.g., by chopping feedback resistors, are prone to creating unwanted mixing products and tend to require relatively large high-voltage switches. Possible designs that inject one or more correction signals to cancel out offset would be gain dependent and have the undesirable side-effect of changing with output voltage.

Accordingly, what is needed are methods for reducing output offset in high-voltage systems that, ideally, allow mismatch contributors to be auto-calibrated on-chip to reduce testing times in production, without requiring excessive die area and chopping switches.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments. Items in the figures are not to scale.

DETAILED DESCRIPTION OF EMBODIMENTS

Figure 1:
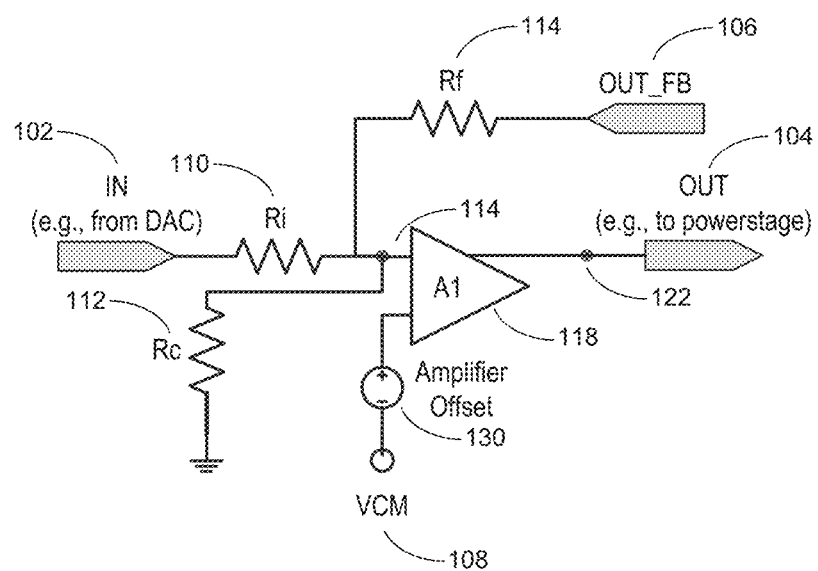
FIG. 1 depicts a simplified control circuit for a class D amplifier, according to various embodiments of the present disclosure.

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated.

The terms "include," "including," "comprise," and "comprising" shall be understood to be open terms and any lists the follow are examples and not meant to be limited to the listed items. Any headings used herein are for organizational purposes only and shall not be used to limit the scope of the description or the claims. Each reference mentioned in this patent document is incorporate by reference herein in its entirety.

It is noted that embodiments described herein are given in the context of class-D amplifiers in audio applications, but one skilled in the art shall recognize that the teachings of the present disclosure are not limited to such applications and may equally be applied in a wide variety of context. Furthermore, it is noted that, in this document, the terms "chopping" and "dynamic element matching" may be used interchangeably. Similarly, the terms "swapping," dynamically swapping," and "switching" may be used interchangeably.

FIG. 1 depicts a simplified control circuit for a class D amplifier, according to various embodiments of the present disclosure. For simplicity control circuit 100 is shown as a single-ended topology. In one or more embodiments, circuit 100 comprises input signal 102, output signal 104, and feedback signal 106 that are coupled to respective nodes 120, 122, and 124, which serves as input to amplifier 118. Amplifier 118, in a feedback configuration, is coupled to feedback resistor 114. As depicted, node 124 is also coupled to input resistor 110 and common mode resistor 112, and the second input of amplifier 118 is coupled to common mode voltage 108 via amplifier offset 130. Control circuit 100 in FIG. 1 may be configured as an integrator with input resistor 110 (denoted as Ri in FIG. 1) coupled to amplifier 118, used as a class-D modulator to drive a power stage. Feedback resistor 114 (denoted as Rf) is used as feedback from the class-D power stage for closed loop control. The ratio of the value of Rf to that of Ri sets the DC gain of the modulator.

In operation, mismatch in the component values Ri and Rf may cause a DC offset at the output of amplifier 118, which can be observed at output node 122 of the modulator. It is desirable to minimize offset and control the voltage at output node 122, i.e., the output voltage of amplifier 118, which may drive a load (not shown) such as a speaker, e.g., to improve audio performance. In particular, contributions from components coupled to the input of amplifier 118 and to the output of amplifier 118 should be reduced such as to make output signal 104 as small as possible when input signal 102 is not present. Potential contributors include amplifier offset, input mismatch, common mode mismatch, feedback mismatch in FIG. 1.

Existing attempts to compensate or eliminate offset and other effects of mismatch, mainly to make the output signal as small as possible, suffer from various drawbacks. For example, existing trimming approaches use a tester-based trimming algorithm that goes through trim settings for internal circuit components, such as resistor Rf, to adjust components to specific values in manufacturing.

However, such methods not only fail to compensate any deviations that may occur post-production when the device is use in regular operation but also fail to account for any external components that may be coupled to the amplifier in regular operation, including any parasitic effects, effects resulting from packaging, and so on, which may inadvertently shift circuit behavior, thus, negatively impacting accuracy. In addition, inaccuracies in the tester itself, device aging effects, etc., may decrease accuracy and other performance parameters.

Accordingly, it would be desirable to have systems and methods that reduce unwanted effects of mismatch of amplifier components to minimize offset, including during regular operation. Various embodiments herein address the output offset caused by the mismatch from feedback resistor 114 and provide for amplifier circuits that are trimmable during and post-production. Advantageously, this reduces the cost and time inherent in existing tester methods.

To achieve minimum total offset, potential contributors should be dealt with separately. Therefore, in embodiments, first, the contribution to offset by amplifier 118 itself may be isolated from other circuit components and trimmed by using a current steering DAC shown in FIG. 2.

Figure 2:
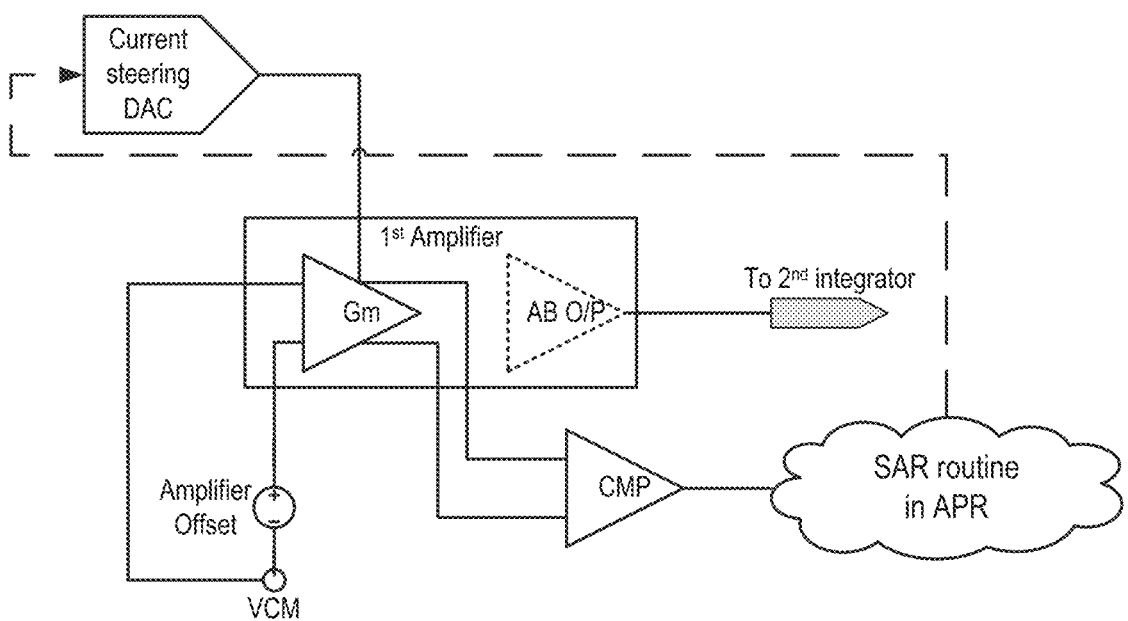
FIG. 2 illustrates the use of a current steering DAC to reduce the contribution to offset by an amplifier, according to various embodiments of the present disclosure.

In embodiments, when trimming amplifier 118 may be configured in a single stage, e.g., by disconnecting the AB output stage (denoted AB O/P in FIG. 2). The inputs of the amplifier may be directly coupled to the common mode voltage VCM, i.e., with no resistors. The output the amplifier that amplifies the offset may be sensed using comparator CMP. Finally, the DAC current may be used to reduce or minimize the offset.

Advantageously, trimming out amplifier mismatch, e.g., by using a current steering DAC such that in FIG. 2, removes the contribution of the amplifier on the total offset and allows the amplifier to be used to sense the error caused by other circuit components, as discussed in greater detail below. It is noted that any other method known in the art may be used to trim out the contribution of the amplifier.

Figure 3:
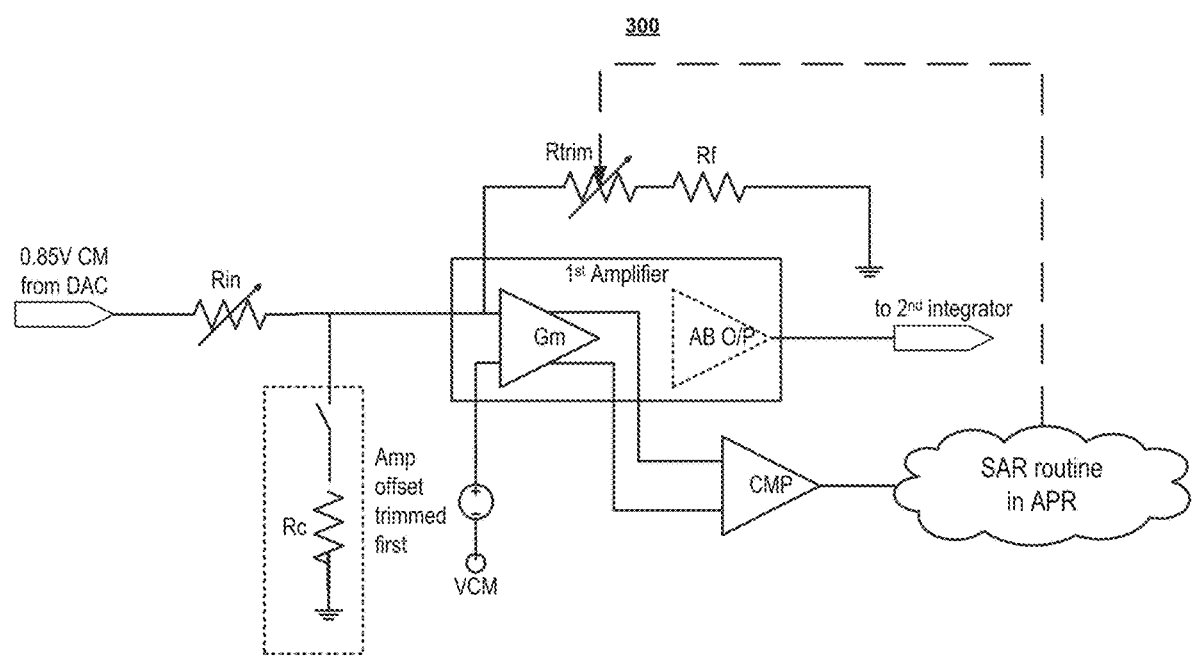
FIG. 3 depicts the use of an "ideal" amplifier in a second phase of a resistor trimming process, according to various embodiments of the present disclosure.

FIG. 3 depicts the use of an "ideal" amplifier in a second phase of a resistor trimming process according to various embodiments of the present disclosure. When sensing differences in resistors and trimming them, an as-ideal-as-possible amplifier should be used to prevent trimming an error that may be present within the amplifier itself. In embodiments, this may be accomplished by using comparator CMP to sense the output of the amplifier and injecting another signal to correct for the mismatch of the amplifier. This may be performed, for example during a startup routine, by a controller or state machine that controls the timing of the sensing or measuring and the subsequent correcting actions.

In embodiments, during a trimming phase of the feedback resistor that is grounded at one terminal, a variable trimming resistor (denoted as Rtrim in FIG. 3) may be used. A person of skill in the art will understand that variable resistors may be implemented by any known method in the art.

The amplifier may be configured in single stage topology, where the AB output stage is disconnected. Further, the common mode resistor Re may be disconnected. To achieve a 0 dB gain setting at the amplifier output, the value of the input resistor should be made equal to the sum of the values of the feedback resistor and the variable trim resistor. The comparator may sense the value at the output of amplifier that is indicative of the difference at the input terminals of the amplifier. The amplifier's output voltage may then be used to adjust the value of the trim resistor in a manner such as to minimize the output voltage. A suitable SAR routine that may be used is discussed further below with reference to FIG. 6.

Figure 4:
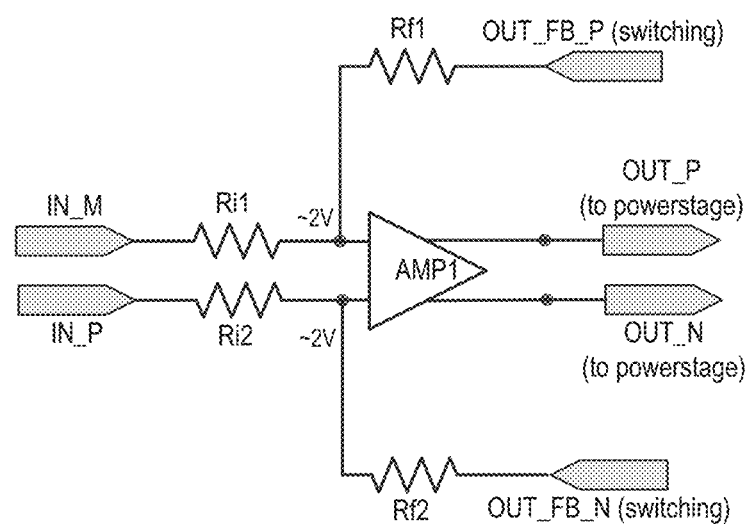
FIG. 4 is an exemplary differential amplifier topology for a calibration circuit, according to various embodiments of the present disclosure.

Various embodiments herein utilize a calibration circuit having a differential amplifier topology such as that shown in FIG. 4 to reduce a DC offset caused by component mismatch. Components of a class-D topology that should be matched comprise the input resistors and the feedback gain resistors in the differential paths of amplifier AMP1.

Figure 5:
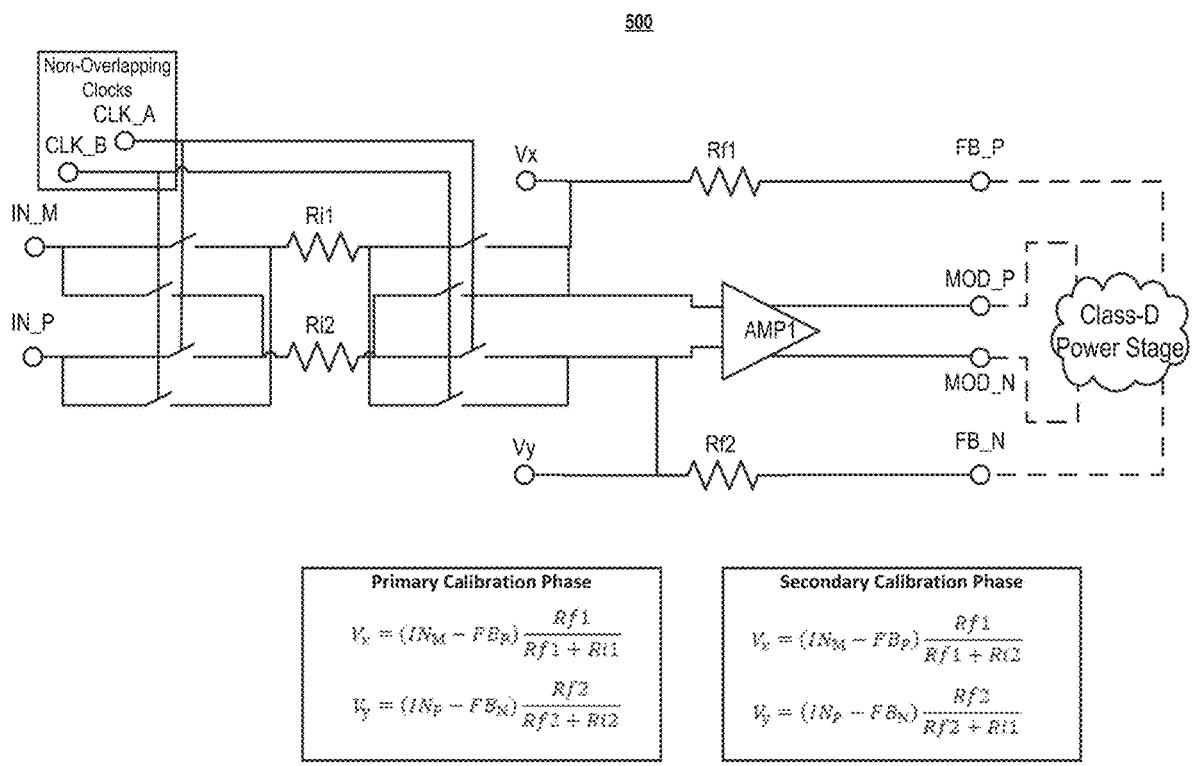
FIG. 5 illustrates a more detailed version of the calibration circuit in FIG. 4.

FIG. 5 illustrates a more detailed version of the calibration circuit shown in FIG. 4, which is a fully differential embodiment of the circuit in FIG. 1. For clarity, components similar to those shown in FIG. 1 and FIG. 4 are labeled in a similar manner. For purposes of brevity, a description or their function is not repeated here.

In a manner similar to FIG. 1, in a calibration phase, e.g., once the offset of amplifier 118 has been isolated according to the method shown in FIG. 2, during a calibration or trim procedure, the common mode resistor (shown in FIG. 1) is disconnected from circuit 500 to prevent such components from contributing to the output of amplifier AMP1. Further, unlike in normal operation, dynamic element matching is disabled and not applied to the common mode resistors (not shown in FIG. 5) and input resistors Ri1 and Ri2.

In embodiments, a mismatch in the resistance values of feedback resistors Rf1 and Rf2 may be sensed and corrected, e.g., in the following manner: First, voltages may be defined at the input of amplifier AMP1 (e.g., by connecting to bandgap reference) and output (e.g., by connecting to ground) of amplifier AMP1. The inputs of amplifier AMP1 may be connected to voltage dividers, and amplifier AMP1 may amplify the differential voltage sensed at the differential input. In embodiments, a process to change values of feedback resistors Rf1 and Rf2 may be used to minimize the differential voltage to obtain and save a first code. Then input resistors Ri1 and Ri2 may be swapped, e.g., by using a switching network that switches their connections, Rf1 and Rf2 may be reset to their initial untrimmed state, and the process may be repeated to, again, minimize the resulting differential voltage and obtain a second code. Finally, an average value for the two codes may be determined and used to cancel out the contribution from input resistors Ri1 and Ri2. As a result, in normal operation, the average code may ensure that the values of feedback resistors Rf1 and Rf2 match each other and the offset error is reduced or, ideally, eliminated altogether. It is noted that since in normal operation input resistors Ri1 and Ri2 are chopped, their individual values do not contribute to the offset error.

In detail, in embodiments, if clock signal CLK_A, is active, input IN_M is connected, through resistor Ri1, to resistor Rf1 and differential amplifier AMP1. Likewise, input IN_P is connected to Rf2 and amplifier AMP1 through resistors Ri2. Conversely, when clock signal CLK_B is active, input IN_M is connected to resistor Rf1 and amplifier AMP1 through resistor Ri2, and IN_P is connected to resistor Rf2 through resistor Ri1. In embodiments, by repeatedly alternating between these two circuit configurations that, in effect, swap input resistor Ri1 with input resistor Ri2, a mismatch in values between input resistors Ri1 and Ri2 may be reduced or eliminated to substantially obtain an average DC voltage of zero Volt.

It is noted that in some instances it is desirable to not switch certain circuit components. In embodiments, resistors Rf1 and Rf2 are thus not dynamically swapped. To minimize the mismatch between feedback resistors Rf1 and Rf2, these resistors may be trimmed, i.e., their resistance values may be calibrated to reduce or minimize their difference. In embodiments, this may be achieved by employing a calibration routine that averages an error.

In embodiments, in a setup phase, when amplifier AMP1 does not perform integration operations, voltage nodes FB_P and FB_N may be connected to zero Volt or a ground reference (not shown in FIG. 5) and voltage nodes IN_P and IN_M may be coupled to the same voltage as each other, e.g., 1V. Then, in a primary calibration phase, e.g., when clock signal CLK_A is active, resistors Ri1 and Rf1 may be used to form a first voltage divider from voltage node IN_M to voltage node FB_P. Likewise, resistors Ri2 and Rf2 may form a second voltage divider from voltage node IN_P to voltage node FB_N. In embodiments, differential amplifier AMP1 may be used to detect a difference between the voltages at its input terminals. If resistance Ri1 equals Ri2 and resistance Rf1 equals Rf2, the voltage difference at the inputs of amplifier AMP1 will be zero, i.e., the input voltages will be identical and, thus, no error will need to be corrected.

In contrast, in scenarios where, e.g., resistance Rf1 is larger than resistance Rf2, the value of Rf2 should be increased to match that of resistance Rf1. Conversely, assuming resistance Rf1 equals Rf2, but resistance Ri1 is larger than Ri2, the value for Rf1 should be increased to balance the voltages at amplifier inputs. As a person of skill in the art will appreciate, resistor values may be adjusted by using any combination of series and parallel circuit configurations.

In embodiments, in a secondary calibration phase, when CLK_B is active, input resistor Ri1 and Ri2 may be swapped such that resistor Ri1 is connected to resistor Rf2, and resistor Ri2 is connected to feedback resistor Rf1. In this phase, if resistance Ri1 equals Ri2 and resistance value Rf1 equals Rf2, again, no error need to be corrected as the voltage difference at the input terminals of amplifier AMP 1 will be zero. If, however, the resistance value of Rf1 is larger than that of Rf2, the resistance of feedback resistor Rf2 should be increased to match that of feedback resistor Rf1, e.g., to balance the amplifier's differential input voltages. And if resistance Ri1 is larger than Ri2, but resistance Rf1 equals Rf2, then, due to the different connections compared to the primary phase, the resistance value of Rf2 (and not Rf1) should be increased.

In embodiments, in a third phase, the two calibration codes associated with the two different calibration phases may be evaluated, e.g., by averaging their codes such that the error contributions from input resistors Ri1 and Ri2 cancel each other out. As a result, in the primary calibration phase when input resistances Ri1 and Ri2 and, respectively, feedback resistances Rf1 and Rf2 equal each other, the codes and, thus, their average is zero, and no change is necessary.

In the abovementioned scenario where resistance Rf1 is larger than resistance Rf2, both codes may be nonzero but corrected for the value of feedback resistor Rf2. Similarly, in the scenario where the value of Rf1 equals that of Rf2, but the value of Ri1 is larger than that of Ri2, the codes may be equal in magnitude, but in the primary phase, the code may be corrected for Rf1 and, in the secondary phase, corrected for Rf2. Since the error is not caused by either of these feedback resistors, no correction of Rf1 or Rf2 would be necessary.

It is noted that although in the above-described example the value of one of the feedback resistors is increased, a person of skill in the art will appreciate that it is equally possible to reduce the resistance value, or alter the value of the counterpart other feedback resistor up or down to match the component values and accomplish the objectives of the present disclosure. A person of skill in the art will further appreciate that it is equally possible to use other passive components, e.g., capacitors to perform a calibration according to embodiments of the present disclosure.

In regular operation, in embodiments, dynamic element matching may be applied to input resistors Ri1 and Ri2, e.g., to average their contribution and to ensure that only the error of the feedback resistor(s) is considered. Stated differently, dynamic element matching may be used to remove mismatch of input resistors Ri1 and Ri2 from the trimming routine for feedback resistors Rf1 and Rf2.

Controller circuit 500 illustrated in FIG. 5 is not limited to the constructional detail shown there or described in the accompanying text. It is understood that calibration may be performed, e.g., at a startup phase in which codes may be stored for use in regular operation. However, this is not intended as a limitation on the scope of the present disclosure since calibration may be performed post-production, e.g., throughout the lifetime of a circuit.

Figure 6:
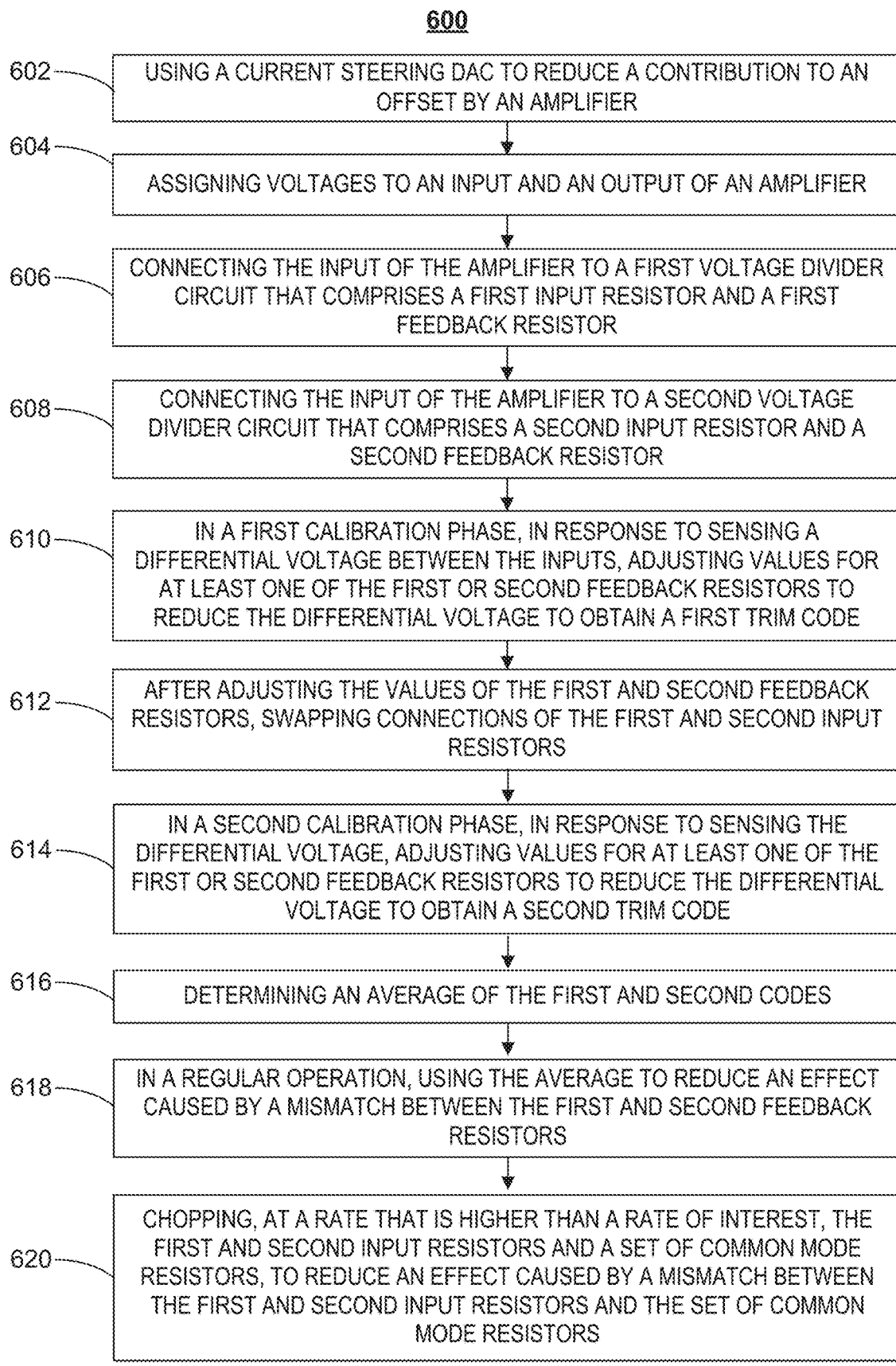
FIG. 6 is a flowchart of an illustrative calibration process in accordance with various embodiments of the present disclosure.

FIG. 6 is a flowchart of an illustrative calibration process in accordance with various embodiments of the present disclosure. In embodiments, calibration process 600 starts at step 602, e.g., when a current steering DAC is used to reduce a contribution to a DC offset by an amplifier.

At step 604, voltages may be assigned to the inputs and output of the amplifier.

At step 606, the input of the amplifier may be connected to a first voltage divider circuit that comprises a first input resistor and a first feedback resistor or a combination of passive circuit components.

At step 608, the input of the amplifier may be connected to a second voltage divider circuit that comprises a second input resistor and a second feedback resistor.

At step 610, e.g., in a first calibration phase, in response to sensing a differential voltage between the inputs, values for at least one of the first or second feedback resistors may be adjusted such as to reduce the differential voltage to obtain a first trim code.

At step 612, e.g., after adjusting the values to the first and second feedback resistors to be substantially equal, connections of the first and second input resistors may be swapped, e.g., by using a switching network.

At step 614, e.g., in a second calibration phase, in response to sensing the differential voltage, values for at least one of the first or second feedback resistors may be adjusted to reduce the differential voltage to obtain a second trim code.

At step 616, an average value of the first and second codes may be determined.

At step 618, e.g., in regular operation, the average value may be used to reduce an effect caused by a mismatch between the first and second feedback resistors.

Finally, at step 620, the first and second input resistors and, e.g., a set of common mode resistors may be chopped, e.g., at a rate that is higher than a rate of interest, such as to reduce an effect caused by a mismatch between the first and second input resistors and/or the set of common mode resistors.

One skilled in the art will recognize that (1) certain steps may optionally be performed; (2) steps may not be limited to the specific order set forth herein; (3) certain steps may be performed in different orders; and (4) certain steps may be done concurrently.

Figure 7:
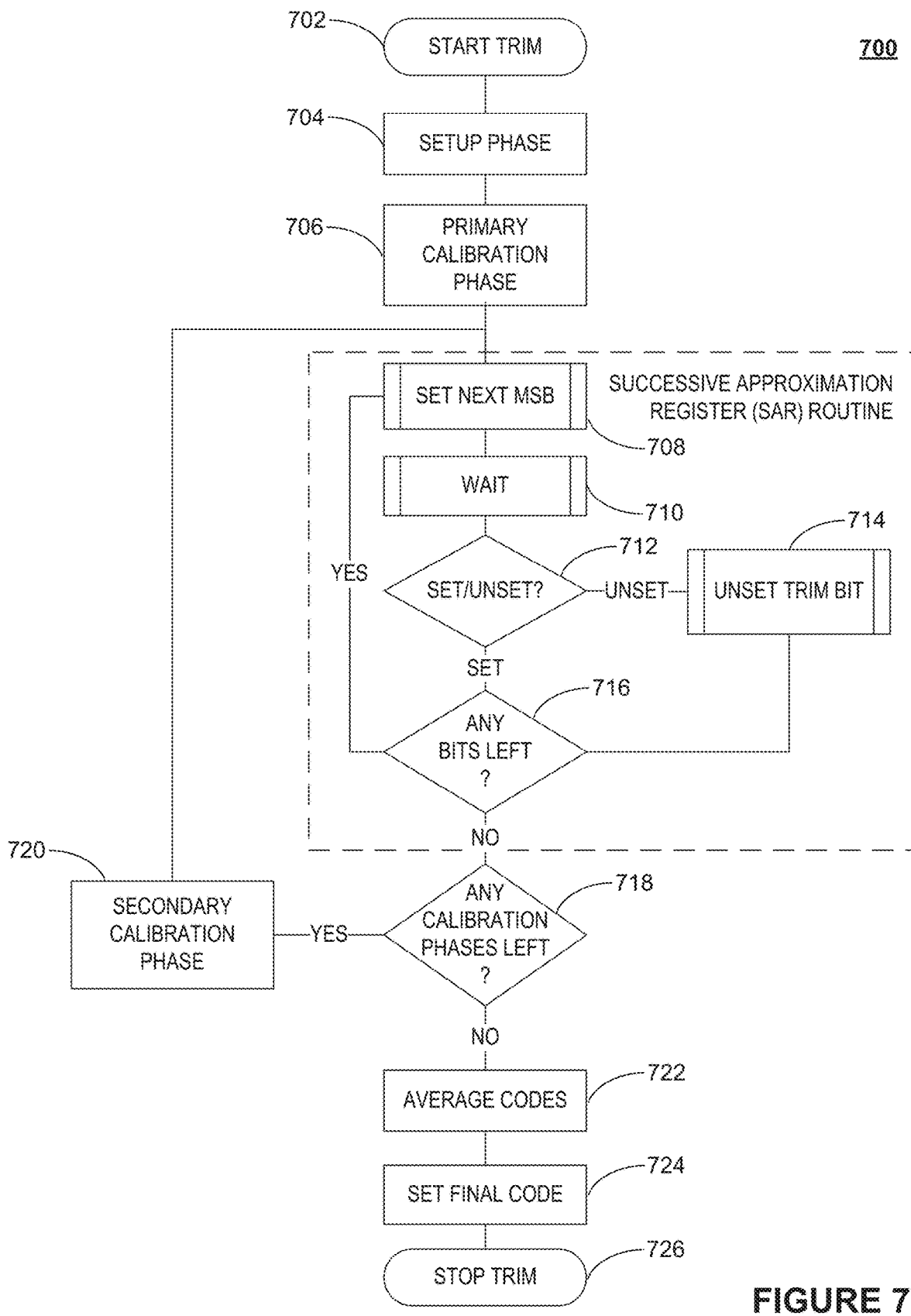
FIG. 7 is a flowchart of an illustrative trimming process in accordance with various embodiments of the present disclosure.

FIG. 7 is a flowchart of an illustrative trimming process in accordance with various embodiments of the present disclosure. In embodiments, trimming process 700 may be applied, for example, to the feedback resistors shown in FIG. 5. Trimming may start at step 702. At step 704, e.g., in a setup phase, an effect of an amplifier on an offset is reduced. In embodiments, this may be accomplished by using the circuit shown in FIG. 2. At step 706, trimming process 700 may enter a primary calibration phase, e.g., to correct for a mismatch in feedback resistors as previously discussed. In embodiments, calibration may comprise a Successive Approximation Register (SAR) routine that may comprise steps 708-716 shown in FIG. 7. In embodiments, the SAR routine may generate a first trim code. Likewise, e.g., after swapping input resistors as indicated at step 612 in FIG. 6, the SAR routine may be used to generate, at step 720, a second trim code associated with a secondary calibration phase.

Once process 700 determines, at step 718, that all calibration phases have completed, i.e., all trim codes have been obtained, process 700 may, at step 722, process those codes, e.g., by applying an averaging method to obtain a final trim code that may be set at step 724 before process 700 may halt trimming, at step 726.

In embodiments, in a regular operation phase, a trim code different from that of the trim code for the resistors may be used to reduce offset caused by the amplifier.

Figure 8:
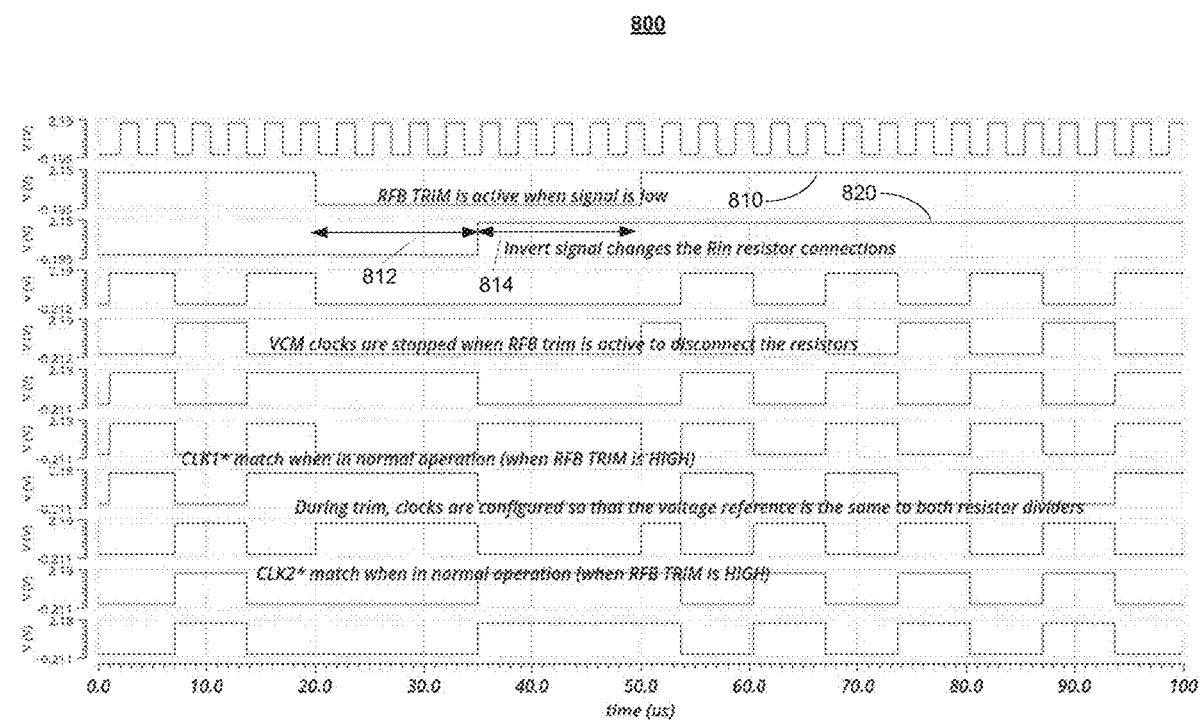
FIG. 8 is an exemplary timing diagram that illustrates the effect of implementing a calibration process according to various embodiments of the present disclosure.

FIG. 8 is an exemplary timing diagram that illustrates the effect of implementing a calibration process according to various embodiments of the present disclosure. It shall be noted that experiments and results are provided by way of illustration and were performed under specific conditions using a specific embodiment or embodiments; accordingly, neither these experiments nor their results shall be used to limit the scope of the disclosure of the current patent document.

As depicted, FIG. 8 comprises trim signal 810, invert signal 820, and various other clock signals. In embodiments, in a trimming phase, RFB trim may be active, e.g., when trim signal 810 in signal sequence 800 is low. In embodiments, in a first calibration phase, denoted as numeral 812 in FIG. 8, a first trim code may be obtained, e.g., by using the SAR routine discussed above with reference to FIG. 7. Then, input resistors coupled to the input of a differential amplifier may be swapped by invert signal 820, e.g., using a suitable switching network such as that shown in FIG. 5 above and, in a second calibration phase, denoted as numeral 814, a second trim code may be obtained by rerunning the SAR routine. In embodiments, the trim codes may be processed, e.g., by applying an averaging function to obtain a final trim code.

It is noted that, in embodiments, switching of input resistors may be performed at a rate that is greatly faster than the input signal bandwidth. As a result, the effect of such switching or dynamic element matching for the purpose of averaging out component value mismatch of the input resistors, i.e., the differential mismatch error, on the performance of the overall circuit will, advantageously, be negligible.

Aspects of the present invention may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using ASIC(s), programmable arrays, digital signal processing circuitry, or the like. Accordingly, the "means" terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present invention may further relate to computer products with a non-transitory, tangible computer-readable medium that have computer code thereon for performing various computer-implemented operations. The media and computer code may be those specially designed and constructed for the purposes of the present invention, or they may be of the kind known or available to those having skill in the relevant arts. Examples of tangible computer-readable media include, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices. Examples of computer code include machine code, such as produced by a compiler, and files containing higher level code that are executed by a computer using an interpreter. Embodiments of the present invention may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present invention. It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A method for self-trimming mismatch in amplifier circuits, the method comprising:
    determining a plurality of trim codes for two or more phases of operation of an amplifier circuit that comprises an amplifier, the plurality of trim codes are determined using steps comprising:
        connecting a first input of the amplifier to a first voltage divider circuit that comprises a first input passive circuit component and a first feedback passive circuit component;
        connecting a second input of the amplifier to a second voltage divider circuit that comprises a second input passive circuit component and a second feedback passive circuit component; and
        in a first calibration phase, in response to sensing a differential voltage between the first and second inputs, adjusting values for at least one of the first or second feedback passive circuit components to update the differential voltage to obtain a first trim code of the plurality of trim codes;
        swapping connections of the first and second input passive circuit components; and
        in a second calibration phase, in response to sensing the differential voltage, adjusting the values to update the differential voltage to obtain a second trim code of the plurality of trim codes; and
    using the plurality of trim codes to determine a final trim code.

2. The method according to claim 1, further comprising, using the final trim code in a regular operation.

3. The method according to claim 1, further comprising, assigning voltages to an input and an output of the amplifier.

4. The method according to claim 1, further comprising, in a regular operation, using an average of the first and second trim codes to reduce an effect caused by a mismatch between the first and second feedback passive circuit components.

5. The method according to claim 4, wherein the first and second feedback passive circuit components are first and second feedback resistors and the first and second input passive circuit components are first and second input resistors.

6. The method according to claim 5, further comprising, chopping, at a rate that is higher than a rate of interest, the first and second input resistors and a set of common mode resistors, to reduce an effect caused by a mismatch between the first and second input resistors and the set of common mode resistors.

7. The method according to claim 1, further comprising, using a current steering DAC to reduce a contribution to an offset by the amplifier.

8. The method according to claim 1, further comprising, using a third trim code, which is different from the first and second trim codes, to reduce offset caused by the amplifier.

9. The method according to claim 1, further comprising, in a regular operation, swapping one or more current sources.

10. A amplifier circuit comprising:
    an amplifier that receives a differential voltage at a first input and a second input;
    a first feedback passive circuit, and a second feedback passive circuit;
    a first input passive circuit component that is coupled to the first input and forms, together with first feedback passive circuit, a first voltage divider circuit; and
    a second input passive circuit component that is coupled to the second input and forms, together with second feedback passive circuit, a second voltage divider circuit,
        wherein at least one of the first or second feedback passive circuit components being adjusted, in a first calibration phase in response to sensing the differential voltage, to update the differential voltage to obtain a first trim code, and
        wherein in response to connections of the first and second input passive circuit components being swapped and the differential voltage being sensed, values for at least one of the first or second feedback passive circuit components being adjusted, in a second calibration phase, to update the differential voltage to obtain a second trim code.

11. The amplifier circuit according to claim 10, wherein the first and second feedback passive circuit components are first and second feedback resistors.

12. The amplifier circuit according to claim 10, wherein the first and second input passive circuit components are first and second input resistors.

13. The amplifier circuit according to claim 12, wherein the first and second input resistors and a set of common mode resistors are chopped at a rate that is higher than a rate of interest such as to reduce an effect caused by a mismatch between the first and second input resistors and the set of common mode resistors.

14. The amplifier circuit according to claim 10, further comprising a current steering DAC that is used to reduce a contribution to an offset by the amplifier.

15. The amplifier circuit according to claim 10, wherein an input and an output of the amplifier are assigned voltages.

16. The amplifier circuit according to claim 10, wherein an average of the first and second trim codes is used in a regular operation.

17. The amplifier circuit according to claim 10, wherein, an average of the first and second trim codes reduces an effect caused by a mismatch between the first and second feedback passive circuit components.

18. The amplifier circuit according to claim 10, wherein a third trim code, which is different from the first and second codes, is used to reduce offset caused by the amplifier.

19. The amplifier circuit according to claim 10, further comprising one or more current sources that are being swapped in a regular operation.

\* \* \* \* \*